(12) United States Patent
Isshiki

(10) Patent No.: US 7,879,412 B2
(45) Date of Patent: Feb. 1, 2011

(54) DIAMOND THIN FILM COATING METHOD AND DIAMOND-COATED CEMENTED CARBIDE MEMBER

(75) Inventor: Hideo Isshiki, Tokyo (JP)

(73) Assignees: The University of Electro-Communications, Tokyo (JP); Campus Create Co., Ltd., Tokyo (JP)

( * ) Notice: Subject to any disclaimer, the term of this patent is extended or adjusted under 35 U.S.C. 154(b) by 921 days.

(21) Appl. No.: 11/628,982

(22) PCT Filed: Jun. 10, 2005

(86) PCT No.: PCT/JP2005/010675

§ 371 (c)(1),
(2), (4) Date: Mar. 13, 2007

(87) PCT Pub. No.: WO2005/121398

PCT Pub. Date: Dec. 22, 2005

(65) Prior Publication Data

US 2007/0259204 A1 Nov. 8, 2007

(30) Foreign Application Priority Data

Jun. 10, 2004 (JP) ............................. 2004-173078

(51) Int. Cl.
*C23C 16/02* (2006.01)
(52) U.S. Cl. .................. 427/577; 427/249.1; 427/249.8; 427/249.13; 427/249.15; 427/255.11; 427/255.18; 427/255.26; 427/255.27

(58) Field of Classification Search .................. 427/577, 427/249.1, 249.8, 249.13, 249.15, 255.11, 427/255.18, 255.26, 255.27; 428/408, 446
See application file for complete search history.

(56) References Cited

U.S. PATENT DOCUMENTS

| | | | | |
|---|---|---|---|---|
| 4,842,937 A | * | 6/1989 | Meyer et al. | 428/408 |
| 5,028,451 A | * | 7/1991 | Ito et al. | 427/577 |
| 5,731,045 A | | 3/1998 | Dearnaley et al. | |
| 6,087,025 A | * | 7/2000 | Dearnaley et al. | 428/698 |

FOREIGN PATENT DOCUMENTS

CN 1275637 A 12/2000

(Continued)

OTHER PUBLICATIONS

Dowling et al "Comparison between acid leaching and siliciding pre-treatments on erosive wear performance of diamond coatings on cemented carbide substrates" Thin Solid Films 377-378 (2000) 239-242.*

(Continued)

*Primary Examiner*—Archene Turner
(74) *Attorney, Agent, or Firm*—NDQ&M Watchstone LLP

(57) ABSTRACT

A diamond thin film coating method is provided that enables, with no need for an intermediate layer, the formation of a diamond thin film, which has conventionally been considered difficult because cobalt contained in a binding phase of a cemented carbide provides a catalysis for the formation of graphite.

Cobalt in a binding phase (11) present in a surface of a cemented carbide substrate member comprised of a hard phase of a carbide (2) and a binding phase (1) containing cobalt, is silicidated into silicide (3), and thereafter the diamond thin film is formed.

2 Claims, 3 Drawing Sheets

FOREIGN PATENT DOCUMENTS

| | | |
|---|---|---|
| JP | 02-054768 A | 2/1990 |
| JP | 05-065646 A | 3/1993 |
| JP | 05-247652 A | 9/1993 |
| JP | 07-305170 A | 11/1995 |
| JP | 2000-178736 A | 6/2000 |
| WO | 03074758 * | 9/2003 |

OTHER PUBLICATIONS

Kubelka et al., "Influences of WC-Co Hard Metal Substrate Pre-Treatments with Boron and Silicon . . . ," Diamond & Related Materials, vol. 3, pp. 1360-1369, 1994.

* cited by examiner

DIAMOND THIN FILM COATING METHOD AND DIAMOND-COATED CEMENTED CARBIDE MEMBER

TECHNICAL FIELD

The present invention relates to a diamond thin film coating method and a diamond-coated cemented carbide member obtained through this coating method.

BACKGROUND ART

Cemented carbides comprised of a hard phase of a carbide and a binding phase containing cobalt, typified by WC—Co as an example, are used in various members such as cutting tools and chuck jigs because of their high hardness, excellent wear resistance and the like. Moreover, to further enhance the wear resistance and durability of such cemented carbide members, a surface of a cemented carbide member is often coated with a thin film harder than the cemented carbide, for example, a TiC thin film.

Among hard thin films publicly known, a diamond thin film has the highest hardness and excellent wear resistance. Therefore, if a cemented carbide substrate member is coated with a diamond thin film, excellent properties can be expected. However, it is conventionally considered difficult to coat a cemented carbide substrate member with a diamond thin film. The reason is that cobalt, which is the primary component of the binding phase of the cemented carbide, or any of nickel and iron, which are sometimes contained in the binding phase as required, is in general a material that can serve as a catalyst when graphite is generated, and accordingly only graphite is generated even if an attempt is made to form a diamond thin film coating on a surface of the cemented carbide substrate member on which any of these materials is present.

For methods for coating a cemented carbide member with a diamond thin film currently proposed, there is a method in which a cemented carbide member is pickled to remove cobalt on a surface of the member with an acid and then coated with a diamond thin film. However, even if the cobalt on the surface of the cemented carbide member is temporarily removed through this method, this attains little effect because cobalt inside the cemented carbide member moves toward the surface due to diffusion under a high-temperature environment for forming the diamond thin film.

Moreover, another method is also proposed in which after cobalt on a surface of a cemented carbide member is removed with an acid, the surface of the cemented carbide member is covered with a thin film of TiN or the like formed as an interlayer film to suppress the catalysis of the cobalt, and a diamond thin film is formed on this interlayer film. In the case of forming a diamond thin film with such an interlayer film interposed, problems may arise such as a matter of adhesion performance between this interlayer film and the diamond thin film, and a separation attributable to a difference in thermal expansion coefficient. Moreover, in this method, an evaporation method or a sputtering method is generally used to form the interlayer film. However, since such evaporation and sputtering methods are completely different from a CVD method for forming the diamond thin film, the process steps are increased. Further, such evaporation and sputtering methods are methods of forming a thin film in such a manner that, in theory, material particles move in a straight line, adhere to a member to be coated, and accumulate thereon. Therefore, there has been a problem that it is difficult for the interlayer film to uniformly adhere to a member having a special geometry, such as a member with projections and depressions or a member in a complex shape.

In addition, Japanese Patent Application Unexamined Publication No. H7-305170 proposes a cemented carbide member coated with a hard film in which a surface of a WC-group cemented carbide is coated with a 0.2 μm to 10 μm thick film of a metal whose carbide has standard energy of formation that becomes a negative value within a specific range at a temperature ranging from ambient temperature to 1500° C., and is then coated with a diamond thin film. The technique disclosed in this Japanese Patent Application Unexamined Publication No. H7-305170 is that the metal film formed on the surface of the cemented carbide is made to react with C during diamond deposition and is thus converted into carbide, whereby a coating of the diamond thin film with high adhesion strength is accomplished. The metal film formed on the surface of the cemented carbide is formed by a vacuum evaporation method, plating method, or sputtering method. Accordingly, the work steps and time are increased because these methods are completely different from a CVD method for forming the diamond thin film. Additionally, in the case of using such a vacuum evaporation method or sputtering method in coating, as described above, it is difficult for the metal film to uniformly adhere to a member having a special geometry, such as a member with protrusions and depressions or a member in a complex shape. In the case of the plating method, usable metals are limited. For example, a coating of a Si film could not be accomplished by the plating method.

Furthermore, Japanese Patent Application Unexamined Publication No. 2000-178736 proposes a member including a base material and a diamond-like carbon film formed thereon, wherein the member has an intermediate layer of any one of silicides, silicarbides and the like of the group 5A elements and the group 6A elements in the periodic table. The technique disclosed in this Japanese Patent Application Unexamined Publication No. 2000-178736 is basically for forming the intermediate layer. Therefore, problems may arise such as a matter of adhesion performance between this intermediate layer and the diamond thin film and a separation attributable to a difference in thermal expansion coefficient.

Patent document 1: Japanese Patent Application Unexamined Publication No. H7-305170

Patent document 2: Japanese Patent Application Unexamined Publication No. 2000-178736

DISCLOSURE OF THE INVENTION

The present invention is made to advantageously solve the above mentioned problems, and it is an object thereof to provide a diamond thin film coating method that enables a favorable diamond thin film to be formed on a cemented carbide substrate member without much increasing the process steps and time, and that further enables a diamond thin film to be uniformly formed on a member with protrusions and depressions or on a member in a complex shape, as well as to provide a diamond-coated cemented carbide member coated using this method.

The present invention is a diamond thin film coating method for forming a diamond thin film on a substrate member, the substrate member being made of a cemented carbide comprised of a hard phase of a carbide and a binding phase containing cobalt, characterized by including: silicidating the cobalt in the binding phase present in a surface of the substrate member into silicide; and thereafter forming the diamond thin film.

Moreover, the present invention is a diamond thin film coating method for forming a diamond thin film on a substrate member, the substrate member being made of a cemented carbide comprised of a hard phase of a carbide and a binding phase containing cobalt, characterized by including: accommodating the substrate member in a reaction chamber of a CVD apparatus; at the same time supplying a silicon raw material gas into this reaction chamber; silicidating the cobalt in the binding phase present in a surface of the substrate member into silicide; and thereafter forming the diamond thin film in the same CVD apparatus.

Further, the present invention is a diamond-coated cemented carbide member characterized by having, on a surface of a cemented carbide substrate member comprised of a hard phase of a carbide and a binding phase containing cobalt, silicide generated by silicidating the cobalt in the binding phase.

According to the diamond thin film coating method of the present invention, since the cobalt present in the surface of the cemented carbide substrate member is converted into silicide by silicidation, cobalt becomes no longer present in the surface of the cemented carbide substrate member. Therefore, the catalysis of cobalt can be suppressed, and it is possible to advantageously prevent the problem that graphite is generated when the diamond thin film is formed. Accordingly, it is possible to coat the cemented carbide with the diamond thin film, and hence the favorable diamond thin film can be formed.

Moreover, desired effects can be obtained if the silicide is generated only in an area where the binding phase appears on the surface of the cemented carbide substrate member. Therefore, neither so many process steps nor so much process time are needed to generate the silicide, and hence the diamond film coating process can be more simplified than the conventional cases.

Further, unlike the conventional technologies, the work of removing cobalt by pickling the surface of the cemented carbide substrate member is not required. Therefore, in this point as well, the manufacturing process can be simplified.

In addition, since the silicide does not need to be formed as an interlayer film, the diamond film coating with high adhesion performance can be obtained.

Furthermore, when the step of silicidating the cobalt present in the surface of the cemented carbide substrate member into silicide is carried out by a CVD method, the silicide can be uniformly formed even on a member with protrusions and depressions or a member in a complex shape. In addition, since the silicidation step can be carried out in the same CVD apparatus for forming the diamond thin film, it is possible to further simplify the process steps and to further reduce the manufacturing time.

BEST MODE FOR CARRYING OUT THE INVENTION

Hereinafter, a diamond thin film coating method and a diamond-coated cemented carbide member of the present invention will be described more specifically.

Figure 1:
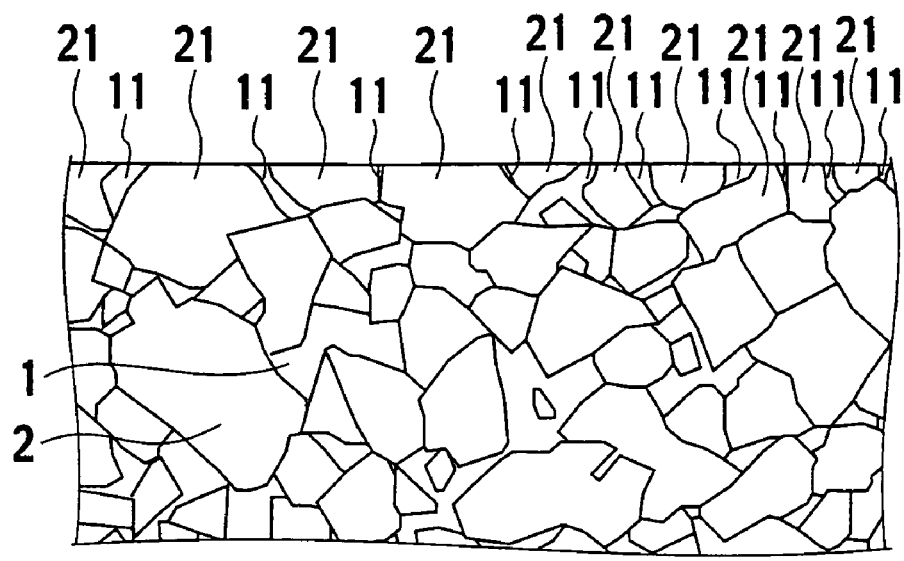
FIG. 1 is a schematic view of a sectional structure in the vicinity of a surface of WC—Co cemented carbide.
Figure 2:
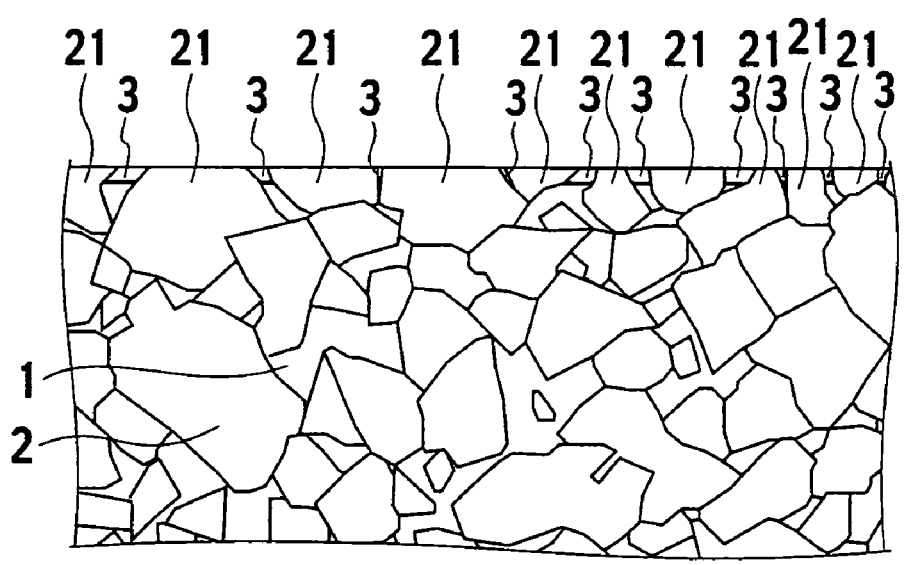
FIG. 2 is a schematic view of a sectional structure in the vicinity of the surface of the WC—Co cemented carbide with silicide formed in the surface.
Figure 3:
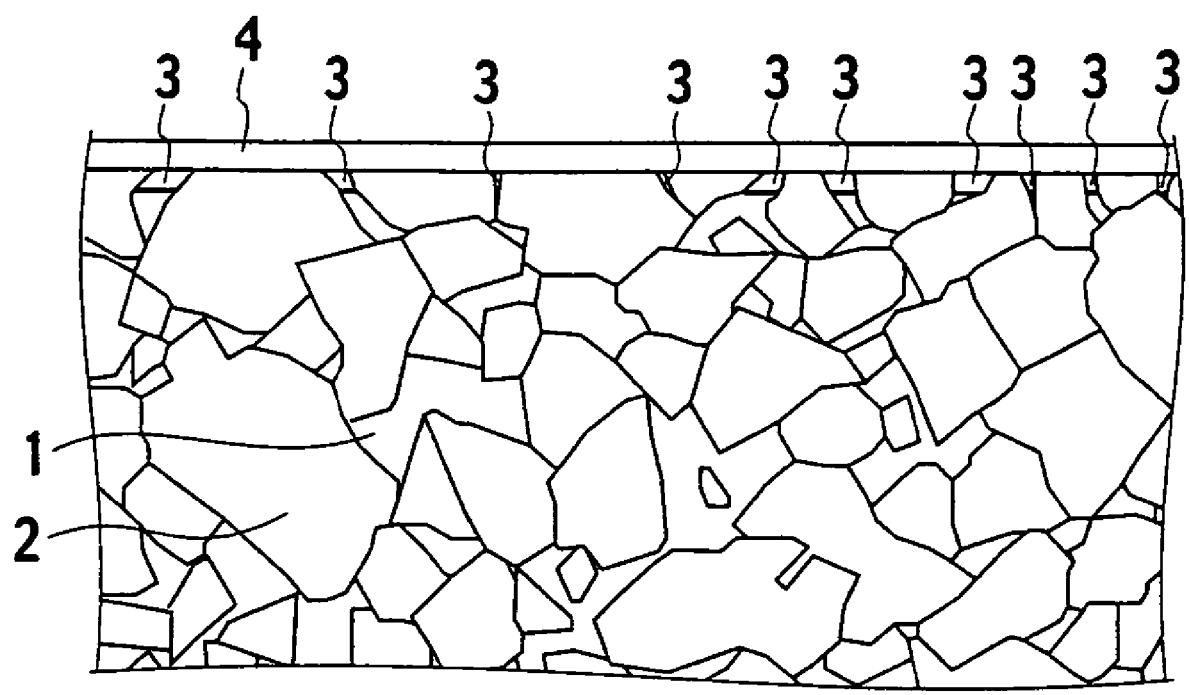
FIG. 3 is a schematic view of a sectional structure in the vicinity of the surface of the WC—Co cemented carbide with a diamond thin film formed on the surface.

FIGS. 1 to 3 are views each schematically showing a sectional structure in the vicinity of a surface of WC—Co cemented carbide in which a hard phase is tungsten carbide (WC) and a binding phase is cobalt (Co), as a representative example of cemented carbides. As shown in FIG. 1, the WC—Co cemented carbide has such a structure that angular particles of tungsten carbide 2, which is the hard phase, are bound together with cobalt 1, which is the binding phase. Note that this structure is not limited to the WC—Co cemented carbide, and cemented carbides having other components and compositions also have similar structures in which portions of the carbide phase are bound together with the binding phase.

Accordingly, in a surface of a WC—Co cemented carbide substrate member that has not been subjected to any treatment, cobalt 1 is present along with tungsten carbide 2. In FIG. 1, a cobalt present in the surface of the substrate member is denoted by numeral 11, and a tungsten carbide present in the surface of the substrate member is denoted by numeral 21. Such cobalt 11 present in the surface serves as a catalyst for the generation of graphite when a diamond thin film is formed. Therefore, conventionally, not a diamond thin film but graphite is formed, as described already.

Accordingly, in the present invention, as shown in FIG. 2, the cobalt 11 present in the surface of the substrate member is silicidated into silicide 3. The cobalt silicide 3 may be CoSi and/or $CoSi_2$, depending on temperature.

If the cobalt 11 present in the surface of the substrate member is silicidated into the silicide 3, the cobalt 11 becomes no longer present in the surface of the cemented carbide substrate member. In addition, the silicide 3 in the surface also serves as a barrier that prevents the cobalt 1 present inside the substrate member from diffusively moving toward the surface. Therefore, when a diamond thin film is formed, troubles attributable to the presence of the cobalt 11 in the surface of the cemented carbide substrate member can be prevented. Accordingly, a diamond thin film 4 as intended can be formed as shown FIG. 3.

Moreover, CoSi or $CoSi_2$, which is the cobalt silicide 3, has a high melting point (1326° C.) and is a compound stable even at high temperature. Therefore, even when the temperature is high (900° C. at the highest) at which a diamond thin film is formed, the silicide 3 is present in a stable state in the surface of the cemented carbide substrate member. Accordingly, the favorable diamond thin film can be formed stably.

Figure 4:
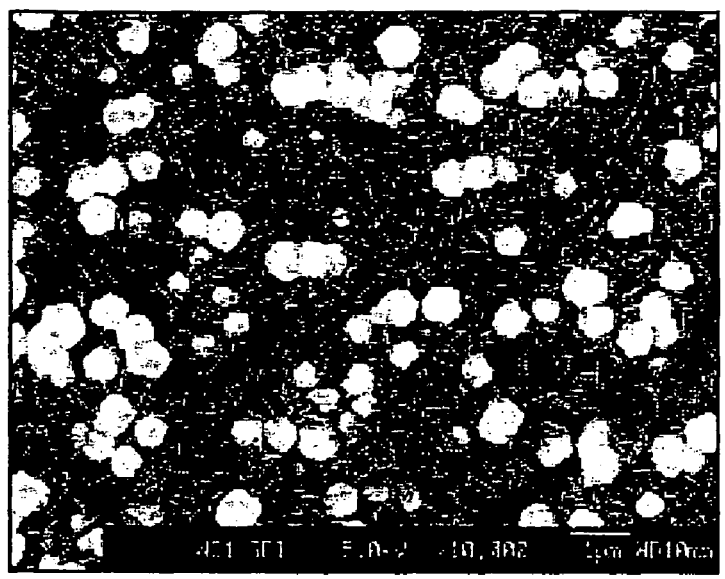
FIG. 4 is a photomicrograph of a cemented carbide surface, showing that diamond crystal grains are formed.
Figure 5:
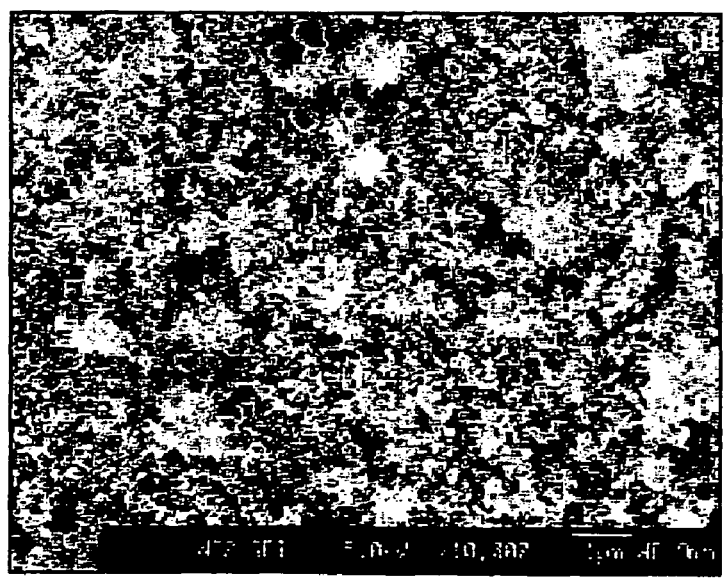
FIG. 5 is a photomicrograph of a cemented carbide surface, showing that graphite is formed.

When the formation of a diamond thin film was experimentally performed after cobalt present in a surface of a cemented carbide was silicidated into silicide in actuality, diamond crystal grains were formed, as the microphotograph of the surface shows in FIG. 4. In FIG. 4, what look like grains are diamond. On the other hand, when the formation of a diamond thin film was attempted without carrying out the step of silicidating cobalt present in a surface of a cemented carbide into silicide, only graphite was formed as shown in FIG. 5, with no diamond formed. In FIG. 5, what look like needles are graphite.

Moreover, from the viewpoint of a manufacturing process, if the cobalt in the surface of the cemented carbide substrate member is silicidated into the silicide, the work of removing the cobalt by pickling the surface of the cemented carbide substrate member as is performed in a conventional technology is not required. In addition, for such silicidation of the cobalt in the surface of the cemented carbide substrate member into the silicide, it is possible to utilize the gradual heating in a process of diamond film formation as described below. Therefore, in this point as well, a simplification of the manufacturing process can be achieved.

Specific methods for silicidating the cobalt 11 in the surface of the cemented carbide substrate member into the silicide include the following methods, for example.

As a first method, a silicon film is formed on a cemented carbide substrate member by a thin film deposition method such as an evaporation method or a sputtering method, and during or after the deposition of this silicon film, heat treatment for heating the cemented carbide substrate member up to 300° C. or more is carried out, whereby the cobalt present at the silicon-cemented carbide interface is converted into silicide, that is, cobalt silicide ($CoSi$, $CoSi_2$). In this case, when a diamond thin film is formed by a CVD method on the cemented carbide substrate member with the silicon film formed thereon, it is necessary to heat the cemented carbide substrate member, which is a member to be coated, at least up to 800 to 900° C., depending on the type of CVD method though. That is, in a process of gradual heating in which the temperature is raised up to diamond deposition temperature, the cemented carbide substrate member certainly undergoes a temperature of approximately 500 to 600° C. Therefore, even if the cemented carbide substrate member with the silicon film formed thereon is not necessarily subjected to another heat treatment step, the cobalt at the silicon-cemented carbide interface can be converted into cobalt silicide ($CoSi$, $CoSi_2$) by utilizing this gradual heating at the time of forming the diamond thin film. As described above, it is advantageous that cobalt silicide is generated in the process of diamond thin film formation by forming the silicon film and then successively performing the diamond thin film formation step, because the favorable diamond thin film in which the generation of graphite is suppressed can be formed with a smaller number of process steps.

Moreover, as a second method, a cemented carbide substrate member is accommodated in a reaction chamber of a CVD apparatus; the temperature of this substrate member is increased to 300° C. or more; at the same time, a silicon raw material gas is supplied into this reaction chamber. Thus, the cobalt in the surface of the cemented carbide also can be converted into cobalt silicide ($CoSi$, $CoSi_2$) through a reaction with silicon formed on the cobalt surface by a CVD method. As for the temperature of this substrate member, since cobalt silicide generation temperature is generally 500° C. or more, it is preferable to heat the substrate member up to 500 to 600° C. or more. However, in the case of heating under a plasma environment, cobalt silicide could be generated even at a low temperature of approximately 300° C.

Such a method of generating cobalt silicide ($CoSi$, $CoSi_2$) through a reaction with silicon formed by a CVD method is more advantageous than by an evaporation method or a sputtering method in the point that this CVD method enables a desired product to be formed on the surface of the substrate member regardless of the geometry thereof, for example, even if the substrate member has a shape with protrusions and depressions or a complex shape.

Moreover, in the case where cobalt silicide ($CoSi$, $CoSi_2$) is formed by using the same CVD apparatus that is used for the following formation of a diamond thin film, the diamond thin film can be formed subsequently to the generation of cobalt silicide only by changing the kind of gas supplied into the reaction chamber of the apparatus and the temperature in the reaction chamber. Accordingly, it is possible to manufacture the diamond-coated cemented carbide member, without increasing the process steps.

Further, since cobalt silicide ($CoSi$, $CoSi_2$) can be formed by utilizing the gradual heating for forming the diamond thin film in the CVD apparatus, the process time can be shorter.

As for the gas supplied into the reaction chamber of the CVD apparatus in the case of forming cobalt silicide ($CoSi$, $CoSi_2$) through a reaction with silicon formed by a CVD method, a single kind of silicon raw material gas alone or a gas mixture of two kinds or more of silicon raw material gas can be used. Some of the examples are monosilane ($SiH_4$), disilane ($Si_2H_6$), dichlorosilane ($SiH_2Cl_2$), silicon tetrachloride ($SiCl_4$), monomethylsilane ($SiH_3CH_3$), dimethylsilane ($SiH_2(CH_3)_2$), trimethylsilane ($SiH(CH_3)_3$), tetramethylsilicon ($Si(CH_3)_4$), tetraethoxysilicon (TEOS: $Si(OC_2H_5)_4$), tetramethoxysilicon (TMOS: $Si(OCH_3)_4$), and the like.

Furthermore, in the case of using, among these silicon raw material gases, a single kind of raw material gas including silicon and carbon alone, or a gas mixture of two kinds or more of raw material gas including silicon and carbon, cobalt silicide is generated on the cobalt surface at a cobalt silicide generation temperature of 300° C. or more, more preferably, 500 to 600° C. or more. Thereafter, the temperature of the cemented carbide substrate member in the reaction chamber of the CVD apparatus is increased, and when the temperature reaches diamond thin film formation temperature, the diamond thin film is formed. Accordingly, it can be omitted to change the kind of gas according to the temperature and state of the cemented carbide substrate member. Some of the examples of such a gas are monomethylsilane ($SiH_3CH_3$), dimethylsilane ($SiH_2(CH_3)_2$), trimethylsilane ($SiH(CH_3)_3$), tetramethylsilicon ($Si(CH_3)_4$), tetraethoxysilicon (TEOS: $Si(OC_2H_5)_4$), tetramethoxysilicon (TMOS: $Si(OCH_3)_4$), and the like.

When cobalt silicide is generated, a gas mixture of a silicon raw material gas and a diamond (carbon) raw material gas may be supplied into the reaction chamber of the CVD apparatus, or alternatively the diamond (carbon) raw material gas may be supplied into the reaction chamber of the CVD apparatus from a line different from a line supplying the silicon raw material gas. Even in these cases, cobalt silicide is generated on the cobalt surface at relatively low cobalt silicide generation temperature. After this cobalt silicide is generated on the cobalt surface, the gas supplied into the reaction chamber is changed to the carbon raw material gas only, and the temperature is increased, whereby the diamond thin film can be formed.

The cobalt silicide generated on the cobalt surface of the cemented carbide substrate member through the above-described method is not formed as an interlayer film but is formed only in the areas where cobalt appears on the surface of the metal substrate member. This point apparently differs from the conventional technologies. On account of the fact that cobalt silicide is not formed as an interlayer film, the problems of poor adhesion performance and a difference in thermal expansion coefficient, which are the problems the conventional technologies forming an interlayer film encounter, do not arise. Moreover, since cobalt silicide does not need to be generated as thick as an interlayer film is formed, neither so many process steps nor so much process time are required to generate the silicide. Accordingly, the diamond film coating process can be more simplified than the conventional cases.

Next, as for the cemented carbide used in the method of the present invention, it is needless to say that the most common WC—Co cemented carbide can be employed, but those containing a metal material other than cobalt as a binding phase and another additive may also be employed. Any of cobalt, nickel and iron provides a catalysis for the generation of graphite. Therefore, by silicidating any of these metals present in a surface of the cemented carbide into silicide according to the present invention, the effects intended in the present invention can be obtained.

Moreover, the method for forming the diamond thin film, which is performed after the cobalt in the binding phase present in the surface of the cemented carbide is silicidated into silicide according to the present invention, is not particularly limited. It suffices that the diamond thin film is formed by using a conventionally known method. For example, the diamond thin film can be formed by a microwave plasma CVD method, RF plasma CVD method, ECR plasma CVD method, hot-filament CVD method, plasma torch CVD method, or the like. In addition, in the case where the process of silicidating the cobalt in the binding phase into silicide is performed by a CVD method, it can be performed by any of the above-cited various CVD methods.

By applying the method of the present invention to a process for coating a cemented carbide with diamond, a diamond-coated cemented carbide member can be obtained that has, on a surface of the cemented carbide substrate member comprised of a hard phase of a carbide and a binding phase containing cobalt, silicide generated by silicidating the cobalt in the binding phase. Since this diamond-coated cemented carbide member having cobalt silicide has a diamond thin film excellent in adhesion performance, it is favorable for use in various members such as cutting tools and chuck jigs.

A silicon film with a thickness of 50 nm was formed on a sample of WC-6-8% Co cemented carbide by a vacuum evaporation method. Subsequently, this sample was accommodated in a reaction chamber of a microwave plasma CVD apparatus for diamond thin film formation. When the formation of a diamond thin film was performed under the conditions that a raw material gas was $CH_4/H_2$ and that the temperature of the sample was 850° C., a favorable diamond thin film was able to be formed. This can be thought to be attributable to the fact that the cobalt at the silicon-cemented carbide interface became cobalt silicide when the temperature was relatively low in the process of diamond thin film formation.

Moreover, a favorable diamond thin film can also be formed in the following manner. A similar sample is accommodated in a reaction chamber of a microwave plasma CVD apparatus for diamond thin film formation, and a silicon raw material gas is supplied into this reaction chamber with this sample in a heated state, whereby the cobalt in the surface of the cemented carbide is converted into cobalt silicide. Subsequently, when a diamond film coating is formed in the same reaction chamber, the gas supplied into this reaction chamber is changed to a gas for diamond thin film formation, and the formation of the diamond thin film is performed under the condition that the temperature of the sample is a deposition temperature similar to the above.

Furthermore, a favorable diamond thin film can also be formed in the following manner. A similar sample is accommodated in a reaction chamber of a microwave plasma CVD apparatus for diamond thin film formation, and a gas for cobalt silicide generation and a gas for diamond deposition are simultaneously supplied during a process of heating this sample, whereby the cobalt in the surface of the cemented carbide is converted into cobalt silicide. Subsequently, when a diamond film coating is formed in the same reaction chamber by further increasing the temperature of the sample, the gases supplied into this reaction chamber are reduced only to the gas for diamond deposition, and the formation of the diamond thin film is performed under the condition that the temperature of the sample is a deposition temperature similar to the above.

The invention claimed is:

1. A diamond thin film coating method for forming a diamond thin film on a substrate member, the substrate member being made of a cemented carbide comprised of a hard phase of a carbide and a bonding phase containing cobalt, the method characterized by comprising:

accommodating the substrate member in a reaction chamber of a CVD apparatus; at the same time supplying a silicon raw material gas into this reaction chamber; silicidating the cobalt in the bonding phase present in a surface of the substrate member into silicide, wherein the silicidation is carried out only on an area where the cobalt appears on the surface of the substrate member; and thereafter forming the diamond thin film in the same CVD apparatus without changing gas type.

2. A diamond thin film coating method for forming a diamond thin film on a substrate member, the substrate member being made of a cemented carbide comprised of a hard phase of a carbide and a bonding phase containing cobalt, the method characterized by comprising:

accommodating the substrate member in a reaction chamber of a CVD apparatus; heating the substrate member; at the same time supplying into this reaction chamber a single kind of raw material gas including one of silicon and carbon, or a gas mixture of two kinds or more of raw material gas including silicon and carbon; at cobalt silicide generation temperature, silicidating the cobalt in the bonding phase present in a surface of the substrate member into silicide, wherein the silicidation is carried out only on an area where the cobalt appears on the surface of the substrate member; and thereafter, by increasing a temperature of the substrate member, forming the diamond thin film in the same CVD apparatus without changing gas type.

* * * * *